United States Patent
Murayama et al.

(10) Patent No.: US 10,535,519 B2
(45) Date of Patent: Jan. 14, 2020

(54) PHOTOCURABLE COMPOSITION, METHOD FOR FORMING A PATTERN, AND METHOD FOR PRODUCING A PHOTOCURED PRODUCT

(71) Applicant: CANON KABUSHIKI KAISHA, Tokyo (JP)

(72) Inventors: Yohei Murayama, Kawasaki (JP); Toshiki Ito, Kawasaki (JP); Chieko Mihara, Isehara (JP); Motoki Okinaka, Inagi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 336 days.

(21) Appl. No.: 15/618,868

(22) Filed: Jun. 9, 2017

(65) Prior Publication Data
US 2017/0278704 A1    Sep. 28, 2017

Related U.S. Application Data

(62) Division of application No. 14/371,293, filed as application No. PCT/JP2013/052783 on Jan. 31, 2013, now Pat. No. 9,704,710.

(30) Foreign Application Priority Data
Feb. 9, 2012    (JP) ................... 2012-026144

(51) Int. Cl.
*H01L 21/027* (2006.01)
*G03F 7/004* (2006.01)
(Continued)

(52) U.S. Cl.
CPC .......... *H01L 21/0274* (2013.01); *B29C 33/62* (2013.01); *B29C 39/026* (2013.01);
(Continued)

(58) Field of Classification Search
CPC ................................................. H01L 21/0274
See application file for complete search history.

(56) References Cited

U.S. PATENT DOCUMENTS 7,935,472 B2    5/2011    Ogino et al.
8,076,386 B2    12/2011   Xu et al.
(Continued)

FOREIGN PATENT DOCUMENTS

CN    101784816 A    7/2010
CN    101872115 A    10/2010
(Continued)

OTHER PUBLICATIONS

Matthew Colburn et al., "Step and Flash Imprint Lithography: A New Approach to High-Resolution Patterning," Proc. SPIE 3676, Emerging Lithographic Technologies III, pp. 379-389 (1999).
(Continued)

*Primary Examiner* — Larry W Thrower
(74) *Attorney, Agent, or Firm* — Venable LLP

(57) ABSTRACT

It is intended to provide a photocured product that is prepared using the photo-imprint method and has favorable pattern precision and improvement in pattern defects. The present invention provides a photocured product obtained by irradiating a coating film in contact with a mold with light, the photocured product containing a fluorine atom-containing surfactant, wherein of secondary ion signals obtained by the surface analysis of the photocured product based on time-of-flight secondary ion mass spectrometry, the intensity of a $C_2H_5O^+$ ion signal is higher than that of a $C_3H_7O^+$ ion signal.

7 Claims, 1 Drawing Sheet

(51) Int. Cl.
  *G03F 7/027* (2006.01)
  *B82Y 15/00* (2011.01)
  *B82Y 10/00* (2011.01)
  *B82Y 40/00* (2011.01)
  *B29C 33/62* (2006.01)
  *B29C 39/02* (2006.01)
  *G03F 7/00* (2006.01)
  *G03F 1/76* (2012.01)
  *H01L 21/308* (2006.01)
  *B29C 35/08* (2006.01)

(52) U.S. Cl.
  CPC .............. *B82Y 10/00* (2013.01); *B82Y 15/00* (2013.01); *B82Y 40/00* (2013.01); *G03F 1/76* (2013.01); *G03F 7/0002* (2013.01); *G03F 7/0046* (2013.01); *G03F 7/0048* (2013.01); *G03F 7/027* (2013.01); *H01L 21/3081* (2013.01); *B29C 2035/0827* (2013.01)

(56) References Cited

U.S. PATENT DOCUMENTS

| | | | |
|---|---|---|---|
| 8,163,813 | B2 | 4/2012 | Kawaguchi et al. |
| 8,258,201 | B2 | 9/2012 | Kawaguchi |
| 9,063,408 | B2 | 6/2015 | Nilsson et al. |
| 2005/0187339 | A1 | 8/2005 | Xu et al. |
| 2006/0035029 | A1 | 2/2006 | Xu et al. |
| 2007/0065757 | A1 | 3/2007 | Ogino et al. |
| 2007/0272825 | A1 | 11/2007 | Xu et al. |
| 2010/0206662 | A1 | 8/2010 | Mitsuoka et al. |
| 2011/0020617 | A1 | 1/2011 | Kawaguchi |
| 2012/0175821 | A1 | 7/2012 | Kawaguchi et al. |
| 2013/0032971 | A1 | 2/2013 | Omatsu et al. |
| 2014/0349086 | A1 | 11/2014 | Ito et al. |

FOREIGN PATENT DOCUMENTS

| | | |
|---|---|---|
| CN | 102027026 A | 4/2011 |
| CN | 102239197 A | 11/2011 |
| EP | 2 199 855 A1 | 6/2010 |
| EP | 2 357 205 A1 | 8/2011 |
| JP | 2006-080447 A | 3/2006 |
| JP | 2007-084625 A | 4/2007 |
| JP | 2010-017936 A | 1/2010 |
| JP | 2010-206189 A | 9/2010 |
| JP | 2011-221365 A | 11/2011 |
| JP | 2011-222732 A | 11/2011 |
| TW | 200602406 A | 1/2006 |
| WO | 2008/155928 A1 | 12/2008 |
| WO | 2013/069511 A1 | 5/2013 |
| WO | 2013/118791 A1 | 8/2013 |

OTHER PUBLICATIONS

Office Action in Taiwanese Application No. 102104385 (dated Oct. 29, 2014).

Extended European Search Report in European Application No. 13746741.1 (dated Jul. 17, 2015).

Notification of Reason for Refusal in Japanese Application No. 2012-026144 (dated Nov. 10, 2015).

First Office Action in Chinese Application No. 201380008685.8 (dated Mar. 2, 2016).

Notice of Preliminary Rejection in Korean Application No. 10-2014-7024341 (dated Apr. 12, 2016).

Communication Pursuant to Article 94(3) EPC in European Application No. 13746741.1 (dated Mar. 10, 2017).

International Search Report in International Application No. PCT/JP2013/052783 (dated May 14, 2013).

International Preliminary Report on Patentability (with Written Opinion) in International Application No. PCT/JP2013/052783 (dated Aug. 12, 2014).

PHOTOCURABLE COMPOSITION, METHOD FOR FORMING A PATTERN, AND METHOD FOR PRODUCING A PHOTOCURED PRODUCT

CROSS-REFERENCE TO RELATED APPLICATIONS

This application is a divisional application of U.S. patent application Ser. No. 14/371,293, which was the National Stage of International Application No. PCT/JP2013/052783, filed Jan. 31, 2013, which claims the benefit of Japanese Patent Application No. 2012-026144, filed Feb. 9, 2012. All of these prior applications are incorporated herein by reference in their entirety.

TECHNICAL FIELD

The present invention relates to a photocured product and a method for producing the same.

BACKGROUND ART

In recent years, semiconductor integrated circuits have been rendered finer and more integrated.

Photolithography is frequently used as a patterning technique for semiconductors. Finer patterns based on the photolithography, however, cannot go beyond the diffraction limit of exposing light.

Thus, a nanoimprint method has been proposed for further promoting finer and higher precision circuits. The nanoimprint method refers to a thin film patterning technique that involves pressing a mold having a fine elevation/depression pattern against a substrate coated with a thin resin film to transfer the elevation/depression pattern in the mold to the thin resin film coating the substrate.

Among the nanoimprint methods, a photo-nanoimprint method disclosed in, for example, NPL 1 has received attention. The photo-nanoimprint method involves: impressing a mold transparent to exposing light onto a photocurable composition coating a substrate; curing the photocurable composition by light irradiation; and demolding the mold from the resulting cured product to produce a fine resist pattern-integrated substrate.

However, some problems should be solved for using the photo-nanoimprint method. One of the problems is that force required for releasing a mold from a cured product, i.e., mold release force, is large. Due to this large mold release force, the photo-nanoimprint method has disadvantages such as pattern defects and the reduced precision of alignment between a mold and a substrate resulting from the coming off of the substrate from the stage.

In response to such problems, PTL 1 discloses a photocured product for imprint, including a deep part disposed on the substrate side and a surface part disposed on the deep part, the surface part having a higher content of a fluorine compound than that of the deep part. Alternatively, PTL 2 discloses a photocurable composition for photo-imprint, including at least one polymerizable monomer, a photopolymerization initiator, and a fluorine atom-containing surfactant.

The photocured product disclosed in PTL 1 is intended to decrease surface energy by means of the fluorine compound contained in the surface part, thereby reducing mold release force produced during the demolding of a mold from the photocured product. Also, PTL 2 is intended to reduce mold release force under principles similar to those of PTL 1 using the photocurable composition containing the fluorine atom-containing surfactant. Unfortunately, the photocurable resin compositions disclosed in PTL 1 and PTL 2 are not sufficiently effective for reducing the mold release force.

CITATION LIST

Patent Literature

PTL 1: Japanese Patent Application Laid-Open No. 2006-080447

PTL 2: Japanese Patent Application Laid-Open No. 2007-084625

Non Patent Literature

NPL 1: Proc. SPIE 3676, Emerging Lithographic Technologies III, P. 379, 1999

SUMMARY OF INVENTION

The present invention has been made to solve the problems of the conventional techniques, and an object of the present invention is to provide a photocured product that is prepared using the photo-imprint method and has favorable pattern precision and improvement in pattern defects.

The photocured product of the present invention is a photocured product obtained by irradiating a photocurable composition in contact with a mold with light, the photocured product containing a fluorine atom-containing surfactant, wherein of secondary ion signals obtained by the surface analysis of the photocured product based on time-of-flight secondary ion mass spectrometry, the intensity of a $C_2H_5O^+$ ion signal is higher than that of a $C_3H_7O^+$ ion signal.

The photocured product of the present invention requires only small mold release force for demolding a mold from the photocured product. The present invention can therefore provide a photocured product that is prepared using the photo-imprint method and has favorable pattern precision and improvement in pattern defects.

Further features of the present invention will become apparent from the following description of exemplary embodiments with reference to the attached drawings.

DESCRIPTION OF EMBODIMENTS

Figure 1A:
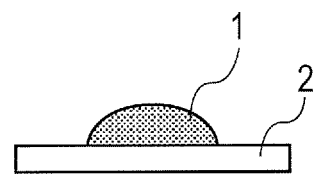
FIGS. 1A, 1B, 1C, 1D, 1E and 1F are a cross-sectional view schematically illustrating one example of a production process for the photocured product of the present invention.

Hereinafter, the embodiments of the present invention will be described appropriately in detail with reference to the drawings. However, the embodiments described below are to be considered in all respects to be illustrative only and not restrictive. Appropriate changes, modifications, etc. may be made in the embodiments described below based on the common knowledge of those skilled in the art without departing from the spirit of the present invention and may be included in the scope of the present invention.

Photocured Product

First, the photocured product of the present invention will be described. The photocured product of the present invention is obtained by irradiating a coating film in contact with a mold with light. In the present invention, the coating film formed for producing the photocured product of the present invention can be a thin film formed by coating a substrate or the like with a photocurable composition described later.

The photocured product of the present invention has the following features (a) and (b):

(a) the photocured product contains a fluorine atom-containing surfactant; and (b) of secondary ion signals obtained by the surface analysis (of the photocured product) based on time-of-flight secondary ion mass spectrometry, the intensity of a $C_2H_5O^+$ ion signal is higher than that of a $C_3H_7O^+$ ion signal.

The present inventors have found that mold release force produced during the demolding of a mold from the photocured product can be reduced by satisfying the requirements (a) and (b).

Hereinafter, the photocured product of the present invention will be described in detail.

(1) Photocured Product

The photocured product of the present invention is a polymer compound obtained by light irradiation. Specifically, the photocured product of the present invention is produced from a photocurable composition containing: a compound that forms a radical or a cation through photochemical reaction (photopolymerization initiator); and a polymerizable monomer. The details of the photocurable composition will be described later.

(2) Fluorine Atom-Containing Surfactant

The fluorine atom-containing surfactant contained in the photocured product of the present invention is distributed mainly in the surface of the photocured product of the present invention and plays a role in reducing mold release force produced during the demolding of the photocured product of the present invention from a mold.

In the present invention, the fluorine atom-containing surfactant can be contained, for example, in the following aspects (i) to (iii), in the photocured product:

(i) the aspect in which the fluorine atom-containing surfactant is contained therein as one component of the photocurable composition;

(ii) the aspect in which a mold surface-coated with the fluorine atom-containing surfactant is contacted with a photocurable composition free from the fluorine atom-containing surfactant so that the fluorine atom-containing surfactant is transferred to the photocurable composition before light irradiation; and (iii) the aspect in which a mold surface-coated with the fluorine atom-containing surfactant is contacted with a photocurable composition free from the fluorine atom-containing surfactant and irradiated with light to transfer the fluorine atom-containing surfactant to the photocured product.

In this context, in the case of using the mold surface-coated with the fluorine atom-containing surfactant as in the aspect (ii) or (iii), repeated imprints may cause the fluorine atom-containing surfactant coating the surface of the mold to gradually come off the surface. By contrast, in the case of using the fluorine atom-containing surfactant contained in the photocurable composition as in the aspect (i), the fluorine atom-containing surfactant is constantly supplied to the mold and the photocured product even during repeated imprints. Thus, excellent repetition durability is obtained in this aspect. Of the aspects (i) to (iii), the aspect (i) is preferred.

(3) Surface Analysis of Photocured Product Based on TOF-SIMS

TOF-SIMS is an analysis method for examining the types of atoms or molecules present on the surface of a solid sample. Hereinafter, the outline of this method will be described briefly.

Upon irradiation with a fast ion beam pulse (primary ions) in high vacuum, solid sample surface generates positively or negatively charged ions (secondary ions) by a sputtering phenomenon and releases these secondary ions in vacuum. These secondary ions are allowed to converge in one direction by an electric field and detected at a position some distance therefrom. The sample surface generates various secondary ions differing in mass according to the composition of the sample surface. Lighter ions fly faster whereas heavier ions fly slower. Thus, the masses of the generated secondary ions can be analyzed by measuring the time from the generation of the secondary ions to their detection (time of flight). Upon irradiation with the primary ions, the solid sample releases, in vacuum, only the secondary ions generated in the outermost surface of the solid sample. Thus, information about the surface (approximately several nm deep) of the sample can be obtained.

The obtained data is a mass spectrum in which m/z (m: secondary ion mass, z: charge ratio) is plotted in the abscissa against the numbers of counts of the detected ions in the ordinate. In this context, the mass of a secondary ion is determined from the position of the signal (hereinafter, also referred to as a peak) of the secondary ion on the abscissa of this mass spectrum. The element composition of the secondary ion is determined from this mass. At the same time, the signal intensity of the secondary ion can be evaluated from the height or area of the peak in the mass spectrum.

Most of the secondary ions obtained in TOF-SIMS are fragment ions formed by the decomposition of molecular structures (fragmentation) accompanying primary ion irradiation. Of the formed fragment ions, ions having hydrogen (H), carbon (C), and oxygen (O) can serve as origins of various organic compounds. Fragment ions that reflect the substructure of an organic compound present mainly in sample surface tend to be obtained as peaks having high signal intensity. Thus, the element composition and signal intensities of the secondary ions formed as fragment ions can be measured and evaluated, thereby predicting the substructures or species of molecules present mainly in the surface of the photocured product.

The fragment ions that are important for the present invention are a $C_2H_5O^+$ ion (m/z=45) and a $C_3H_7O^+$ ion ion (m/z=45) and a $C_3H_7O^+$ ion (m/z=59). The possible source of generation of the $C_2H_5O^+$ ion is mainly a compound containing ethylene oxide (—$CH_2CH_2O$—) as a repeating unit or the like in the substructure. On the other hand, the possible source of generation of the $C_3H_7O^+$ ion is mainly a compound containing propylene oxide (—$CH_2CH_2CH_2O$—) as a repeating unit or the like in the substructure. In this context, a feature of the photocured product of the present invention is that of fragments obtained by TOF-SIMS, the $C_2H_5O^+$ ion is larger in number than the $C_3H_7O^+$ ion. This means that the surface portion of the photocured product mainly has ethylene oxide (—$CH_2CH_2O$—), not propylene oxide (—$CH_2CH_2CH_2O$—). However, this does not mean that the substructure of the surface of the photocured product, which serves as an origin of the $C_2H_5O^+$ ion, is occupied by ethylene oxide (—$CH_2CH_2O$—).

In this context, the compound having ethylene oxide (—$CH_2CH_2O$), which is the main source of generation of the $C_2H_5O^+$ ion in the photocured product of the present invention, may be the polymer compound on which the photocured product is based, or the fluorine atom-containing surfactant.

The precise reason why particularly the fluorine atom-containing surfactant having ethylene oxide can be used in the present invention remains to be elucidated. However, some hypotheses can be made from the viewpoint of the affinity of the substructure containing ethylene oxide or other substructures for compound molecules other than the fluorine atom-containing surfactant. The possible hypotheses are as described in, for example, the following (i) to (iii):

(i) First Hypothesis

A first possible hypothese is that: since ethylene oxide has lower affinity for a fluorine atom than that of propylene oxide, an interface is formed between ethylene oxide and the fluorine atom in the fluorine atom-containing surfactant attached on the mold side so that the affinity therebetween is further reduced to reduce mold release force.

(ii) Second Hypothesis

A second possible hypothesis is that: since ethylene oxide has lower affinity for a polymerizable monomer than that of propylene oxide, the fluorine atom-containing surfactant structurally containing ethylene oxide has a higher surface segregation effect and consequently promotes the effect of reducing mold release force by fluorine.

(iii) Third Hypothesis

A third possible hypothesis is that: since ethylene oxide has higher affinity for quartz than that of propylene oxide, the fluorine atom-containing surfactant structurally containing ethylene oxide is easily attached to mold surface by the photo-imprint method described later and consequently promotes the effect of reducing mold release force by fluorine.

(3) TOF-SIMS Measurement

Next, the TOF-SIMS measurement method will be described.

A general liquid metal ion such as $Ga^+$ as well as a cluster ion such as $Au_3^+$ or $Bi_3^+$ can be used as a primary ion species in the TOF-SIMS method from the viewpoint of ionization efficiency, mass resolution, etc. However, in the present invention, the primary ion used in the TOF-SIMS measurement is not limited to these ions.

Suitable analysis conditions for the TOF-SIMS measurement can be defined neither easily nor univocally. Typical conditions will be described below. Specifically, the primary ion pulse frequency ranges from 1 kHz to 50 kHz; the primary ion beam energy ranges from 12 keV to 25 keV; and the primary ion beam pulse width ranges from 0.5 ns to 10 ns. In the case of an insulator sample, the surface of the sample may be neutralized with electron beam. 16 to 512 repetitive scans of the primary ion beam in a measurement area of 10 μm to 500 μm square can be performed with a pixel area of 64 to 512 pixels square, thereby simultaneously obtaining the mass spectrum of the measurement area and the secondary distribution image of the secondary ions.

The signal intensity of each ion obtained by the TOF-SIMS measurement can be calculated as the height or area of a selected peak positioned at the desired m/z from the obtained mass spectrum.

In the present invention, the respective signal intensities of at least the $C_2H_5O^+$ ion (m/z=45) and the $C_3H_7O^+$ ion (m/z=59) are calculated.

In the present invention, the signal intensity of a secondary ion other than the $C_2H_5O^+$ ion and the $C_3H_7O^+$ ion may be calculated. For example, the signal intensity of an $F^+$ ion (m/z=19) may also be calculated for the purpose of confirming that the fluorine group of the fluorine atom-containing surfactant is present in the surface. Also, in the case of using a (meth)acrylic acid compound as a polymerizable monomer, the signal intensity of a $C_3H_3O^+$ ion (m/z=55) may be calculated for the purpose of confirming that an acrylic group is present in the surface of a photopolymerization product.

The TOF-SIMS measurement described above can be carried out for a plurality of regions in consideration of the in-plane distribution of sample surface, and an average of the obtained values can be determined. Alternatively, the whole surface of the sample may be assayed in a stage raster measurement mode to calculate the signal intensity thereof.

Photocurable Composition

Next, the photocurable composition of the present invention will be described. The photocurable composition of the present invention has at least a polymerizable monomer, a photopolymerization initiator, and a fluorine atom-containing surfactant. Hereinafter, each component contained in the photocurable composition will be described.

(1) Polymerizable Monomer (Component A)

Examples of the polymerizable monomer (component A) contained in the photocurable composition of the present invention include radical-polymerizable monomers and cation-polymerizable monomers.

(1-1) Radical-Polymerizable Monomer

Specifically, a compound having one or more acryloyl groups ($CH_2$=CHCOO—) or methacryloyl groups ($CH_2$=C($CH_3$) COO—) can be used as a radical-polymerizable monomer.

Examples of the monofunctional (meth)acrylic compound having one acryloyl group or methacryloyl group include, but not limited to, phenoxy ethyl (meth)acrylate, phenoxy-2-methylethyl (meth)acrylate, phenoxy ethoxyethyl (meth)acrylate, 3-phenoxy-2-hydroxypropyl (meth)acrylate, 2-phenylphenoxy ethyl (meth)acrylate, 4-phenylphenoxy ethyl (meth)acrylate, 3-(2-phenylphenyl)-2-hydroxypropyl (meth)acrylate, (meth)acrylate of p-cumylphenol reacted with ethylene oxide, 2-bromophenoxy ethyl (meth)acrylate, 2,4-dibromophenoxy ethyl (meth)acrylate, 2,4,6-tribromophenoxy ethyl (meth)acrylate, phenoxy (meth)acrylate modified with two moles or more of ethylene oxide or propylene oxide, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxy diethylene glycol (meth)acrylate, polyethylene glycol mono(meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxy methyl (meth)acrylamide, N,N-dimethyl(meth)acrylamide, t-octyl(meth)acrylamide, dimethylaminoethyl (meth)acrylate, diethylaminoethyl (meth)acrylate, 7-amino-3,7-dimethyloctyl (meth)acrylate, N,N-diethyl(meth)acrylamide, and N,N-dimethylaminopropyl(meth)acrylamide.

Of the compounds described above, examples of the commercially available monofunctional (meth)acrylic compound include, but not limited to, Aronix M101, M102, M110, M111, M113, M117, M5700, TO-1317, M120, M150, and M156 (all manufactured by Toagosei Co., Ltd.), MEDOL10, MIBDOL10, CHDOL10, MMDOL30, MEDOL30, MIBDOL30, CHDOL30, LA, IBXA, 2-MTA, HPA, and Biscoat #150, #155, #158, #190, #192, #193, #220, #2000, #2100, and #2150 (all manufactured by Osaka Organic Chemical Industry, Ltd.), Light Acrylate BO-A, EC-A, DMP-A, THF-A, HOP-A, HOA-MPE, HOA-MPL, PO-A, P-200A, NP-4EA, and NP-8EA, and epoxy ester M-600A (all manufactured by Kyoeisha Chemical Co., Ltd.), KAYARAD TC110S, R-564, and R-128H (all manufactured by Nippon Kayaku Co., Ltd.), NK ester AMP-10G and AMP-20G (all manufactured by Shin-Nakamura Chemical Co., Ltd.), FA-511A, 512A, and 513A (all manufactured by Hitachi Chemical Co., Ltd.), PHE, CEA, PHE-2, PHE-4, BR-31, BR-31M, and BR-32 (all manufactured by Dai-Ichi Kogyo Seiyaku Co., Ltd.), VP (manufactured by BASF), and ACMO, DMAA, and DMAPAA (all manufactured by Kohjin Holdings Co., Ltd.).

Examples of the polyfunctional (meth)acrylic compound having two or more acryloyl groups or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl) isocyanurate tri(meth)acrylate, tris (acryloyloxy) isocyanurate, bis(hydroxymethyl) tricyclodecane di(meth)acrylate, dipentaerythritol penta (meth)acrylate, dipentaerythritol hexa(meth)acrylate, EO-modified 2,2-bis(4-((meth)acryloyloxy)phenyl)propane, PO-modified 2,2-bis(4-((meth)acryloyloxy)phenyl)propane, and EO,PO-modif ied 2,2-bis(4-((meth)acryloyloxy)phenyl) propane.

Of the compounds described above, examples of the commercially available polyfunctional (meth)acrylic compound include, but not limited to, Yupimer UV SA1002 and SA2007 (all manufactured by Mitsubishi Chemical Corp.), Biscoat #195, #230, #215, #260, #335HP, #295, #300, #360, #700, GPT, and 3PA (all manufactured by Osaka Organic Chemical Industry, Ltd.), Light Acrylate 4EG-A, 9EG-A, NP-A, DCP-A, BP-4EA, BP-4PA, TMP-A, PE-3A, PE-4A, and DPE-6A (all manufactured by Kyoeisha Chemical Co., Ltd.), KAYARAD PET-30, TMPTA, R-604, DPHA, DPCA-20, -30, -60, and -120, HX-620, D-310, and D-330 (all manufactured by Nippon Kayaku Co., Ltd.), Aronix M208, M210, M215, M220, M240, M305, M309, M310, M315, M325, and M400 (all manufactured by Toagosei Co., Ltd.), and Ripoxy VR-77, VR-60, and VR-90 (all manufactured by Showa Highpolymer Co., Ltd.).

The radical-polymerizable monomers listed above may be used alone or in combination of two or more types thereof.

In the compounds listed above, the (meth)acrylate means the combination of acrylate and methacrylate sharing common ester moieties. The (meth)acryloyl group means the combination of acryloyl and methacryloyl groups. The term EO refers to ethylene oxide. The EO-modified compound means having a block structure of an ethylene oxide group. The term PO refers to propylene oxide. The PO-modified compound means having a block structure of a propylene oxide group.

(1-2) Cation-Polymerizable Monomer

A compound having one or more vinyl ether groups ($CH_2$=CH—O—), epoxy groups, or oxetanyl groups can be used as a cation-polymerizable monomer.

Examples of the compound having one vinyl ether group include, but not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethyl cyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxy polyethylene glycol vinyl ether.

Examples of the compound having two or more vinyl ether groups include, but not limited to, divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and polyfunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide-added trimethylolpropane trivinyl ether, propylene oxide-added trimethylolpropane trivinyl ether, ethylene oxide-added ditrimethylolpropane tetravinyl ether, propylene oxide-added ditrimethylolpropane tetravinyl ether, ethylene oxide-added pentaerythritol tetravinyl ether, propylene oxide-added pentaerythritol tetravinyl ether, ethylene oxide-added dipentaerythritol hexavinyl ether, and propylene oxide-added dipentaerythritol hexavinyl ether.

Examples of the compound having one epoxy group include, but not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethyl cyclohexene oxide, 3-acryloyloxymethyl cyclohexene oxide, and 3-vinyl cyclohexene oxide.

Examples of the compound having two or more epoxy groups include, but not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl) adipate, vinyl cyclohexene oxide, 4-vinyl epoxy cyclohexane, bis(3,4-epoxy-6-methylcyclohexylmethyl) adipate, 3,4-epoxy-6-methylcyclohexyl-3',4'-epoxy-6'-methylcyclohexane carboxylate, methylenebis(3,4-epoxycyclohexane), dicyclopentadiene diepoxide, di(3,4-epoxycyclohexylmethyl) ether of ethylene glycol, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, and 1,2,5,6-diepoxycyclooctane.

Examples of the compound having one oxetanyl group include, but not limited to, 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl) ether, isobornyloxyethyl(3-ethyl-3-oxetanylmethyl) ether, isobornyl(3-ethyl-3-oxetanylmethyl) ether, 2-ethylhexyl(3-ethyl-3-oxetanylmethyl) ether, ethyl diethylene glycol(3-ethyl-3-oxetanylmethyl) ether, dicyclopentadiene(3-ethyl-3-oxetanylmethyl) ether, dicyclopentenyloxyethyl(3-ethyl-3-oxetanylmethyl) ether, dicyclopentenyl(3-ethyl-3-oxetanylmethyl) ether, tetrahydrofurfuryl(3-ethyl-3-oxetanylmethyl) ether, tetrabromophenyl(3-ethyl-3-oxetanylmethyl) ether, 2-tetrabromophenoxyethyl (3-ethyl-3-oxetanylmethyl) ether, tribromophenyl(3-ethyl-3-oxetanylmethyl) ether, 2-tribroinophenoxy ethyl (3-ethyl-3-oxetanylmethyl) ether, 2-hydroxyethyl(3-ethyl-3-oxetanylmethyl) ether, 2-hydroxypropyl (3-ethyl-3-oxetanylmethyl) ether, butoxyethyl(3-ethyl-3-oxetanylmethyl) ether, pentachlorophenyl(3-ethyl-3-oxetanylmethyl) ether, pentabromophenyl(3-ethyl-3-oxetanylmethyl) ether, and bornyl(3-ethyl-3-oxetanylmethyl) ether.

Examples of the compound having two or more oxetanyl groups include, but not limited to, polyfunctional oxetanes such as 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl) ether, triethylene glycol bis(3-ethyl-3-oxetanylmethyl) ether, tetraethylene glycol bis (3-ethyl-3-oxetanylmethyl) ether, tricyclodecanediyldimethylene(3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy) hexane, pentaerythritol tris(3-ethyl-3-oxetanylmethyl) ether, pentaerythritol tetrakis(3-ethyl-3-oxetanylmethyl) ether, polyethylene glycol bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone-modified dipentaerythritol pentakis(3-ethyl-3-oxetanylmethyl) ether, ditrimethylolpropane tetrakis(3-ethyl-3-oxetanylmethyl) ether, EO-modified bisphenol A bis(3-ethyl-3-oxetanylmethyl) ether, PO-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, and EO-modified bisphenol F (3-ethyl-3-oxetanylmethyl) ether.

The cation-polymerizable monomers listed above may be used alone or in combination of two or more types thereof. EO refers to ethylene oxide. The EO-modified compound has a block structure of an ethylene oxide group. PO refers to propylene oxide. The PO-modified compound has a block structure of a propylene oxide group.

(2) Photopolymerization Initiator (Component B)

The photopolymerization initiator (component B) contained in the photocurable composition of the present invention needs to be selected appropriately for use according to the properties of the polymerizable monomer as component A. Specifically, in the case of using the radical-polymerizable monomer as component A, a photo-radical-generating agent is used. Alternatively, in the case of using the cation-polymerizable monomer as component A, a photo-acid-generating agent is used.

(2-1) Photo-Radical-Generating Agent

The photo-radical-generating agent refers to a compound that can chemically react upon exposure to radiation such as infrared rays, visible light, ultraviolet rays, far-ultraviolet rays, X-rays, or charged particle beam (e.g., electron beam) to form a radical necessary for the initiation of radical polymerization.

Examples of such compounds include, but not limited to, optionally substituted 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, and 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, and 4,4'-dimethoxybenzophenone, 4,4'-diaminobenzophenone; aromatic ketone derivatives such as 2-benzyl-2-dimethylamino-1-(4-morpholinophenyl)-butanone-1,2-methyl-1-[4-(methylthio)phenyl]-2-morpholino-propanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyldimethylketal; acridine derivatives such as 9-phenyl acridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropylthioxanthone, 2-chlorothioxanthone; and xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis-(2,6-dimethoxybenzoyl)-2,4,4-trimethylpentylphosphine oxide.

Of the compounds described above, examples of the commercially available photo-radical-generating agent include, but not limited to, Irgacure 184, 369, 651, 500, 819, 907, 784, and 2959, CGI-1700, -1750, and -1850, CG24-61, and Darocur 1116 and 1173 (all manufactured by Ciba Japan Co., Ltd.), Lucirin TPO, LR8893, and LR8970 (all manufactured by BASF), and Ubecryl P36 (manufactured by UCB).

The photo-radical-generating agents listed above may be used alone or in combination of two or more types thereof.

(2-2) Photo-Acid-Generating Agent

The photo-acid-generating agent refers to a compound that can chemically react upon exposure to radiation such as infrared rays, visible light, ultraviolet rays, far-ultraviolet rays, X-rays, or charged particle beam (e.g., electron beam) to form an acid (proton) for the initiation of cation polymerization. Examples of such compounds include, but not limited to, onium salt compounds, sulfone compounds, sulfonic acid ester compounds, sulfonimide compounds, and diazomethane compounds. In the present invention, an onium salt compound is preferably used.

Examples of the onium salt compound can include iodonium salt, sulfonium salt, phosphonium salt, diazonium salt, ammonium salt, and pyridinium salt. Specific examples of the onium salt compound include, but not limited to, bis(4-t-butylphenyl)iodonium perfluoro-n-butanesulfonate, bis(4-t-butylphenyl) iodonium trifluoromethanesulfonate, bis(4-t-butylphenyl)iodonium 2-trifluoromethylbenzenesulfonate, bis(4-t-butylphenyl) iodonium pyrenesulfonate, bis(4-t-butylphenyl) iodonium n-dodecylbenzenesulfonate, bis(4-t-butylphenyl)iodonium p-toluenesulfonate, bis(4-t-butylphenyl) iodonium benzenesulfonate, bis(4-t-butylphenyl) iodonium 10-camphorsulfonate, bis(4-t-butylphenyl) iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl) sulfonium 2-trifluoromethylbenzenesulfonate, diphenyl(4-t-butylphenyl)sulfonium pyrenesulfonate, diphenyl(4-t-butylphenyl)sulfonium n-dodecylbenzenesulfonate, diphenyl(4-t-butylphenyl) sulfonium p-toluenesulfonate, diphenyl(4-t-butylphenyl) sulfonium benzenesulfonate, diphenyl(4-t-butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris(4-methoxyphenyl)sulfonium trifluoromethanesulfonate, tris(4-methoxyphenyl)sulfonium 2-trifluoromethylbenzenesulfonate, tris(4-methoxyphenyl) sulfonium pyrenesulfonate, tris(4-methoxyphenyl)sulfonium n-dodecylbenzenesulfonate, tris(4-methoxyphenyl) sulfonium p-toluenesulfonate, tris(4-methoxyphenyl) sulfonium benzenesulfonate, tris(4-methoxyphenyl) sulfonium 10-camphorsulfonate, and tris(4-methoxyphenyl) sulfonium n-octanesulfonate.

Examples of the sulfone compound can include β-ketosulfone, β-sulfonylsulfone, and α-diazo compounds thereof. Specific examples of the sulfone compound include, but not limited to, phenacyl phenyl sulfone, mesityl phenacyl sulfone, bis(phenylsulfonyl)methane, and 4-trisphenacylsulfone.

Examples of the sulfonic acid ester compound can include alkylsulfonic acid ester, haloalkylsulfonic acid ester, arylsulfonic acid ester, and iminosulfonate. Specific examples of the sulfonic acid ester compound include, but not limited to, α-methylolbenzoin perfluoro-n-butanesulfonate, α-methylolbenzoin trifluoromethanesulfonate, and α-methylolbenzoin 2-trifluoromethylbenzenesulfonate.

Specific examples of the sulfonimide compound include, but not limited to, N-(trifluoromethylsulfonyloxy)succinimide, N-(trifluoromethylsulfonyloxy) phthalimide, N-(trifluoromethylsulfonyloxy)diphenylmaleimide, N-(trifluoromethylsulfonyloxy) bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptane-5,6-oxy-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy) bicyclo[2.2.1]heptane-5,6-oxy-2,3-dicarboximide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboximide, N-(4-methylphenylsulfonyloxy)-7-oxabicyclo[2.2.1]hept-5-ene-2,3-dicarboximide, N-(4-methylphenylsulfonyloxy)bicyclo[2.2.1]heptane-5,6-oxy-2,3-dicarboximide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxy)bicyclo[2.2.1]heptane-5,6-oxy-2,3-dicarboximide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxy)bicyclo[2.2.1]heptane-5,6-oxy-2,3-dicarboximide, and N-(4-fluorophenylsulfonyloxy) naphthylimide.

Specific examples of the diazomethane compound include, but not limited to, bis(trifluoromethylsulfonyl)diazomethane, bis(cyclohexylsulfonyl)diazomethane, bis(phenylsulfonyl)diazomethane, bis(p-toluenesulfonyl) diazomethane, methylsulfonyl p-toluenesulfonyldiazomethane, (cyclohexylsulfonyl)(1,1-dimethylethylsulfonyl)diazomethane, and bis(1,1-dimethylethylsulfonyl)diazomethane.

Of these photo-acid-generating agents, an onium salt compound is preferred. In the present invention, the photo-acid-generating agents listed above may be used alone or in combination of two or more types thereof.

The blending ratio of the photopolymerization initiator (B) component is 0.01% by weight or more and 10% by weight or less, preferably 0.1% by weight or more and 7% by weight or less, with respect to the total amount of the polymerizable monomer (component A) contained in the photopolymerization composition of the present invention. If the blending ratio is less than 0.01% by weight, the resulting photocurable composition may have low reaction efficiency due to a reduced curing rate. If the blending ratio exceeds 10% by weight, a cured product of the resulting photocurable composition for photo-imprint may be inferior in mechanical properties.

(3) Fluorine Atom-Containing Surfactant (Component C)

It is desired that the photocurable composition of the present invention should contain a fluorine atom-containing surfactant. The fluorine atom-containing surfactant is distributed in a thin film form in the interface between a photocured product and a mold during photocured product preparation described later. The fluorine atom-containing surfactant serves as a kind of coating material for a photocured product. In this context, the fluorine atom contained in the fluorine atom-containing surfactant brings about the effect of reducing surface energy. It is considered that mold release force required for demolding a mold from the photocured product in photocured product preparation can be reduced by virtue of this effect.

The fluorine atom-containing surfactant contained in the photocurable composition of the present invention is preferably a compound having ethylene oxide (—$CH_2CH_2O$—), more preferably a compound represented by the following formula [1]:

$R_1$-$x_1$-$R_2$-$x_2$-$R_3$     [1],

In the formula [1], $R_1$ represents a perfluoroalkyl group. Specific examples of the perfluoroalkyl group represented by $R_1$ include linear alkyl groups having 2 to 20 carbon atoms and fluorine atoms replaced for all hydrogen atoms, such as perfluoroethyl, perfluoropropyl, perfluorobutyl, perfluoropentyl, perfluorohexyl, perfluoroheptyl, perfluorooctyl, perfluorononyl, and perfluorodecyl groups. The number of carbon atoms in the perfluoroalkyl group can be 7 or less from the viewpoint of environment safety.

In the formula [1], $R_2$ represents a divalent substituent containing ethylene oxide. In this context, the divalent substituent containing ethylene oxide is specifically the following divalent substituent (i) or (ii):

(i) a polyalkylene oxide chain containing ethylene oxide; and (ii) an alkyl chain containing ethylene oxide.

Specific examples of the divalent substituent (i) include polyethylene oxide chains having 1 to 100 repeating units and polypropylene oxide chains (—$CH_2CH(CH_3)O$—) having 1 to 100 repeating units.

Specific examples of the divalent substituent (ii) include a polymer chain having a polyethylene oxide chain having 1 to 100 repeating units and a linear alkyl group having 2 to 100 carbon atoms, and a polymer chain having a polyethylene oxide chain having 1 to 100 repeating units and an alkyl group containing a cyclic structure.

In the formula [1], $R_3$ represents a polar functional group. Examples of the polar functional group represented by $R_3$ include alkylhydroxyl, carboxyl, thiol, pyridyl, silanol, and sulfo groups.

In the formula [1], $x_1$ and $x_2$ each represent a single bond or a divalent substituent. In the case where either $x_1$ or $x_2$ is a divalent substituent, specific examples thereof include alkylene, phenylene, naphthylene, ester, ether, thioether, sulfonyl, secondary amino, tertiary amino, amide, and urethane groups.

These fluorine atom-containing surfactants may be used alone or in combination of two or more types thereof.

The blending ratio of the fluorine atom-containing surfactant contained in the photocurable composition of the present invention is determined with respect to the total amount of the polymerizable monomer (component A) contained in the photocurable composition. Specifically, the blending ratio is 0.001% by weight to 5% by weight, preferably 0.002% by weight to 4% by weight, more preferably 0.005% by weight to 3% by weight, of the total amount of component A.

(Additional Component)

The photocurable composition of the present invention may contain additional components according to various purposes without impairing the effects of the present invention, in addition to the polymerizable monomer (component A), photopolymerization initiator (component B), and fluorine atom-containing surfactant (component C) described above. In this context, the additional components are specifically components such as sensitizers, antioxidants, solvents, and polymer components. Hereinafter, their respective specific examples will be described.

(Sensitizer)

The photocurable composition of the present invention may be supplemented with a sensitizer for the purpose of promoting polymerization reaction or improving the rate of conversion of the reaction. A hydrogen donor or a sensitizing dye may be added thereto as the sensitizer.

The hydrogen donor refers to a compound that reacts with an initiating radical formed from the photopolymerization initiator (component B) or a radical at the propagating end to form a more highly reactive radical. The hydrogen donor can be added in the case where the photopolymerization initiator (component B) is a photo-radical-generating agent.

A heretofore known compound commonly used can be used as the hydrogen donor. Specifically, examples thereof include, but not limited to, amine compounds such as N-butylamine, di-n-butylamine, tri-n-butylphosphine, allylthiourea, s-benzylisothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine; and mercapto compounds such as 2-mercapto-N-phenylbenzimidazole and mercaptopropionic acid ester.

The sensitizing dye refers to a compound having the property of being excited by the absorption of light having a particular wavelength to induce interaction with the photopolymerization initiator (component B). In this context, the interaction specifically encompasses energy transfer, electron transfer, or the like from the sensitizing dye in an excited state.

A heretofore known compound commonly used can be used as the sensitizing dye. Specifically, examples thereof include, but not limited to, anthracene derivatives, anthraquinone derivatives, pyrene derivatives, perylene derivatives, carbazole derivatives, benzophenone derivatives, thioxanthone derivatives, xanthone derivatives, thioxanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

These sensitizers may be used alone or in combination of two or more types thereof. The content of the sensitizer in the photocurable composition of the present invention is preferably 0 to 20% by weight, more preferably 0.1% by weight to 5.0% by weight, further preferably 0.2% by weight to 2.0% by weight, with respect to the total amount of the polymerizable monomer as component A. In this context, the sensitizer at a content of 0.1% by weight or more can more effectively exert its effects. Also, the sensitizer at a content of 5% by weight or less results in a photocured product that has a sufficiently high molecular weight and can be prevented from causing poor dissolution or deterioration of storage stability.

(Method for Blending Each Component)

The photocurable composition of the present invention can be prepared by mixing the components described above. In this context, temperature conditions for mixing and dissolving the components of the photocurable composition usually range from 0° C. to 100° C. A solvent may be used for preparing the photocurable composition. In this context, the solvent used for preparing the photocurable composition is not particularly limited as long as the solvent does not cause phase separation from the polymerizable monomer.

(Viscosity of Composition)

The viscosity of the photocurable composition of the present invention is preferably 1 cP to 100 cP, more preferably 5 cP to 50 cP, further preferably 6 cP to 20 cP, in terms of the viscosity of the mixture of the components except for the solvent at 23° C. A photocurable composition having viscosity higher than 100 cP may require a long time for filling depressed portions in the fine pattern on a mold with the composition when contacted with the mold or may cause pattern defects due to poor filling. By contrast, a photocurable composition having viscosity lower than 1 cP may be unevenly spread during coating or may be leaked from the end of a mold when contacted with the mold.

(Surface Tension of Composition)

The surface tension of the photocurable composition of the present invention is preferably 5 mN/m to 70 mN/m, more preferably 7 mN/m to 35 mN/m, further preferably 10 mN/m to 32 mN/m, in terms of the surface tension of the mixture of the components except for the solvent at 23° C. In this context, a photocurable composition having surface tension lower than 5 mN/m requires a long time for filling depressed portions in the fine pattern on a mold with the composition when contacted with the mold. By contrast, a photocurable composition having surface tension higher than 70 mN/m has low surface smoothness.

(Impurities)

It is desired that impurities should be removed as much as possible from the photocurable composition of the present invention. For example, the components of the photocurable composition can be mixed and then filtered through, for example, a filter having a pore size of 0.001 μm to 5.0 μm in order to prevent particles contaminating the photocurable composition from causing pattern defects in a photocured product. The filtration using a filter can be carried out at multiple stages or repeated several times. Alternatively, the filtrate may be filtered again. A filter made of polyethylene resin, polypropylene resin, fluorine resin, nylon resin, or the like can be used in the filtration, though the filter is not limited thereto.

In the case of using the photocurable composition of the present invention for producing a semiconductor integrated circuit, the contamination of the composition with metal impurities can be minimized so as not to inhibit the operation of the product. In this regard, the concentration of metal impurities contained in the photocurable composition of the present invention is preferably 10 ppm or lower, more preferably 100 ppb or lower.

Method for producing photocured product Next, the method for producing the photocured product will be described.

Figure 1B:
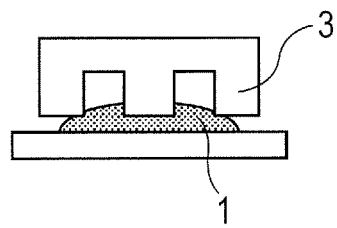
Figure 1C:
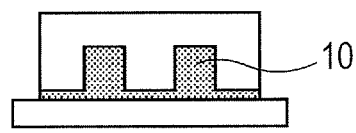
Figure 1D:
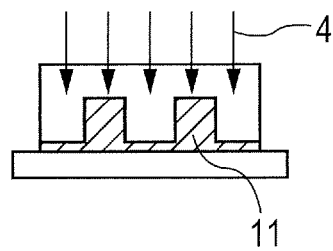
Figure 1E:
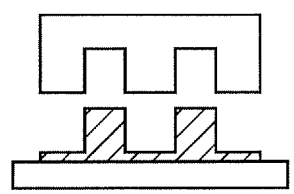
Figure 1F:
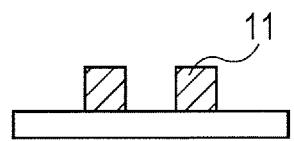

FIGS. 1A to 1F are each a cross-sectional view schematically illustrating one example of a production process of the method for producing the photocured product of the present invention. The photocured product of the present invention is produced according to the production process illustrated in FIGS. 1A to 1F, i.e., steps (i) to (v) shown below. The method of the present invention includes at least steps (i) to (iv) shown below. For the actual production of the photocured product, the step of preparing a photocurable composition containing a polymerizable monomer and a fluorine atom-containing surfactant (photocurable composition preparation step) is performed before step (i) (coating film formation step):

(i) the step of coating a substrate with a photocurable composition to form a coating film (coating film formation step; FIG. 1A);

(ii) the step of contacting the coating film with a mold (imprinting step; FIGS. 1B and 1C);

(iii) the step of irradiating the coating film with light via the mold to cure the coating film (light irradiation step; FIG. 1D);

(iv) the step of releasing the mold from the coating film thus irradiated with light to form a film having a predetermined pattern shape on the substrate (mold release step; FIG. 1E); and (v) the step of removing a residual film that remains in a region from which the coating film should be removed in the pattern shape (residual film removal step; FIG. 1F).

Hereinafter, the steps (i) to (v) will be described in detail. The method for producing the photocured product of the present invention is a nanoimprint method using light. Also, the film produced by the production method of the present invention has a pattern of preferably 1 nm to 10 mm, more preferably approximately 10 nm to 100 μm, in size.

(1) Coating Film Formation Step

First, the step of coating a substrate with a photocurable composition to form a coating film (coating film formation step) is performed. In this step (coating film formation step), as illustrated in FIG. 1A, a coating film made of a photocurable composition, i.e., pattern-replicating layer 1, is formed on a substrate material (substrate 2).

A silicon wafer is usually used as the substrate material, though the substrate material is not limited thereto. Instead of the silicon wafer, the substrate material can be selected arbitrarily for use from among known substrates for semiconductor devices made of aluminum, titanium-tungsten alloy, aluminum-silicon alloy, aluminum-copper-silicon alloy, silicon oxide, silicon nitride, or the like. The substrate (substrate material) used may be surface-treated by, for example, silane coupling treatment, silazane treatment, or thin organic film formation, thereby improving the adhesion of the substrate to the photocurable composition.

For example, an ink jet, dip coat, air knife coat, curtain coat, wire bar coat, gravure coat, extrusion coat, spin coat, or slit scan method can be used for coating the substrate material with the photocurable composition of the present invention. The film thickness of the pattern-replicating layer (coating film) differs depending on how to use the product and is, for example, 0.01 μm to 100.0 μm.

(2) Imprinting Step

Next, the step of contacting the coating film formed in the preceding step (coating film formation step) with a mold (imprinting step; FIGS. 1B and 1C) is performed. In this step (imprinting step), a mold 3 is contacted with the pattern-replicating layer 1 (FIG. 1B) so that depressed portions in the fine pattern formed on the mold 3 are filled with (a portion of) the coating film 10 (FIG. 1C).

The mold 3 used in the contact step needs to be made of a light-transmissive material in consideration of the subsequent step (light irradiation step). Examples of the constituent material for the mold can specifically include glass, quartz, light-transparent resins such as PMMA and polycarbonate resins, transparent vapor-deposited metal films, flexible films such as polydimethylsiloxane, photo-curable films, and metal films. In the case of using a light-transparent resin as the constituent material for the mold, it is required to select a resin that is not soluble in the solvent contained in the photocurable composition 1.

The mold 3 used in the method for producing the photocured product of the present invention may be surface-treated in order to improve the demolding between the photocurable composition 1 and the surface of the mold 3. The surface treatment method may be treatment with a silicone or fluorine silane coupling agent or may specifically use a commercially available coating-type mold release agent such as Optool DSX manufactured by Daikin Industries, Ltd.

In the contact step, as illustrated in FIG. 1B, the pressure applied to the pattern-replicating layer 1 when the mold 3 is contacted with the pattern-replicating layer 1 is not particularly limited and is usually 0.1 MPa to 100 MPa. Particularly, 0.1 MPa to 50 MPa is preferred, and 0.1 MPa to 30 MPa is more preferred, with 0.1 MPa to 20 MPa further preferred. Also, in the contact step, the duration of the contact between the mold 3 and the pattern-replicating layer 1 is not particularly limited and is usually 1 second to 600 seconds, preferably 1 second to 300 seconds, more preferably 1 second to 180 seconds, particularly preferably 1 second to 120 seconds.

The contact step can be performed under any condition selected from an ambient atmosphere, a reduced-pressure atmosphere, and an inert gas atmosphere. In the case of performing the imprinting step in an inert gas atmosphere, specific examples of the inert gas used include nitrogen, carbon dioxide, helium, argon, various chlorofluorocarbon gases, and mixed gases thereof.

(3) Light Irradiation Step

Next, the step of irradiating the coating film with light via the mold (light irradiation step; FIG. 1C) is performed. In this step, the coating film is cured by light irradiation to form a photocured product 11.

In this context, the light with which the pattern-replicating layer 1 is irradiated is selected according to the sensitivity wavelength of the photocurable composition and can specifically be selected appropriately for use from among ultraviolet light, X-rays, electron beam, and the like having a wavelength on the order of 150 nm to 400 nm. In this context, many commercially available photopolymerization initiators (component B) are compounds having sensitivity to ultraviolet light. For this reason, the light with which the pattern-replicating layer 1 is irradiated (irradiation light 4) is particularly preferably ultraviolet light. In this context, examples of the light source of the ultraviolet light include high-pressure mercury lamps, ultrahigh-pressure mercury lamps, low-pressure mercury lamps, Deep-UV lamps, carbon-arc lamps, chemical lamps, metal halide lamps, xenon lamps, KrF excimer laser, ArF excimer laser, and $F_2$ excimer laser. An ultrahigh-pressure mercury lamp is particularly preferred. The number of the light sources used may be one or may be two or more. The light irradiation may be performed for the whole surface of the pattern-replicating layer 1 or may be performed only for a partial region thereof.

Alternatively, the pattern-replicating layer may be cured thermally. In such a case, heat curing may be further performed. In the case of heat curing, the atmosphere and temperature, etc. of heating are not particularly limited. For example, the pattern-replicating layer 1 can be heated at a temperature ranging from 40° C. to 200° C. in an inert atmosphere or under reduced pressure. Also, the pattern-replicating layer 1 can be heated using a hot plate, an oven, a furnace, or the like.

(4) Mold Release Step

Next, the step of releasing the mold from the photocurable composition to form a film having a predetermined pattern shape on the substrate (mold release step; FIG. 1E). This step (mold release step) is the step of demolding the mold from the pattern-replicating layer, whereby a reversed pattern of the fine pattern formed on the mold is obtained as a pattern in the photocurable composition cured in the preceding step (light irradiation step).

The method for demolding the mold 3 from the cured pattern-replicating layer (cured film 11) is not particularly limited as long as the demolding method does not physically damage a portion of the cured film 11. Likewise, various conditions, etc. are not particularly limited. For example, the substrate material (substrate 2) is fixed, and the mold 3 may be moved away from the substrate material, thereby demolding the mold. Alternatively, the mold 3 is fixed, and the substrate material may be moved away from the mold, thereby demolding the mold. Alternatively, the mold 3 and the substrate material may be pulled toward opposite direction, thereby demolding the mold.

Also, the mold 3 may be demolded from the cured film 11 by adopting a method using a coating-type mold release agent. In this context, for demolding the mold 3 from the cured film 11 using the coating-type mold release agent, the step of forming a coating-type mold release agent layer on the surface of the mold having the desired pattern is performed before the imprinting step.

Examples of the type of the coating-type mold release agent used include, but not particularly limited to, silicon mold release agents, fluorine mold release agents, polyethylene mold release agents, polypropylene mold release agents, paraffin mold release agents, montan wax mold release agents, and carnauba wax mold release agents. These mold release agents may be used alone or in combination of two or more types thereof. Among these mold release agents, a fluorine mold release agent is particularly preferred.

(5) Residual Film Removal Step

The film obtained by the mold release step has a particular pattern shape. However, a portion of the film may exist as a residual film in a region other than the region having this pattern shape. Thus, the step of removing a photocurable composition (residual film) that remains in a region from which the photocurable composition should be removed in the pattern shape (residual film removal step; FIG. 1F) is performed.

In this context, examples of the method for removing the residual film include a method involving removing the film (residual film) that remains in the depressed portions of the pattern-replicating layer by etching to expose the surface of the substrate material at the depressed portions in the pattern.

A specific method for the etching used is not particularly limited, and a heretofore known method, for example, dry etching can be performed. A heretofore known dry etching apparatus can be used in the dry etching. A source gas for the dry etching is selected appropriately according to the element composition of the film to be etched. For example, oxygen atom-containing gas such as $O_2$, CO, or $CO_2$, inert gas such as He, $N_2$, or Ar, chlorine gas such as $Cl_2$ or $BCl_3$, or any of other gases such as $H_2$ or $NH_3$ can be used. These gases may be mixed for use.

The film having the pattern formed by the photo-nanoimprint method as described above can be used as, for example, a film for interlayer insulators for semiconductor devices such as LSI, system LSI, DRAM, SDRAM, RDRAM, or D-RDRAM or a resist film for semiconductor device production.

Specifically, the present invention provides methods according to the following embodiments using the photocurable composition of the embodiment described above.

The present invention provides a method for forming a pattern in a cured product using a mold having a elevated/depressed surface and a method for producing a cured product having a pattern.

The present invention also provides, as a method for producing a circuit substrate such as a semiconductor device, a method for producing a circuit substrate, comprising: applying a photocurable composition onto a substrate material; pressing a mold against the photocurable composition to form a pattern in the photocurable composition; irradiating the photocurable composition having the pattern with light to prepare a cured product having the pattern; and releasing the mold from the cured product to form, on the substrate material, a circuit structure based on the pattern in the cured product.

EXAMPLES

Hereinafter, the present invention will be described in more detail with reference to Examples. However, the present invention is not limited to Examples described below. In the description below, the term "part" means "part by weight" unless otherwise specified. The term "%" means "% by weight" unless otherwise specified.

[Synthesis Example 1] Synthesis of Fluorine Atom-Containing Surfactant (C-1)

(1) The inside of a 300-mL reactor was kept in a nitrogen atmosphere, while the following reagents and solvents were added into this reactor:
Hexaethylene glycol (PEG6): 26.5 g (93.9 mmol, 1.0 eq.)
Carbon tetrachloride ($CCl_4$): 36.1 g (235 mmol, 2.5 eq.)
Tetrahydrofuran (THF): 106 mL Next, the reaction solution was cooled to −30° C. Next, dimethylaminophosphine (15.3 g, 93.9 mmol, 1.0 eq.) diluted in THF (24 mL) was gradually added to the reaction solution over 2 hours, and the mixture was then stirred at the same temperature for 30 minutes. Next, the reactor was taken out of the cooling bath, and the reaction solution was then stirred at room temperature for 2 hours. Subsequently, city water (250 mL) was added to the reaction solution (pale yellow suspension) to separate the reaction solution into two layers ($CCl_4$ layer and aqueous layer). Then, the aqueous layer was collected. Subsequently, the aqueous layer was washed twice with isopropyl ether (IPE) (150 mL). Next, a suspension obtained by suspending potassium hexafluorophosphate ($KPF_6$, 34.5 g, 188 mmol, 2.0 eq.) in city water (250 mL) was prepared and then added to the aqueous layer, and the mixture was then sufficiently stirred. Subsequently, solvent extraction operation was performed three times using dichloromethane (200 mL). The organic layers were combined, then washed with city water (400 mL) and saturated saline (300 mL) in this order, and dried over anhydrous magnesium sulfate. Then, the organic layer was concentrated under reduced pressure to obtain 53 g of a light brown liquid (hereinafter, referred to as component "C-1-a").

(2) The following reagents and solvents were added to a 500-mL reactor:
1H,1H-perfluoro-1-heptanol: 34.2 g (97.7 mmol, 1.2 eq.)
THF: 120 mL Next, 60% NaH (3.9 g, 97.7 mmol, 1.2 eq.) was gradually added to the reaction solution without foaming the reaction solution. Then, the reaction solution was heated to 50° C. and stirred at this temperature (50° C.) for 1 hour. Subsequently, the solvent was distilled off under reduced pressure. To the obtained residue, component C-1-a (53 g) dissolved in anhydrous dioxane (600 mL) was added. Subsequently, the reaction solution was heated to 60° C. and stirred at this temperature (60° C.) for 48 hours. Subsequently, the reaction solution in a suspension state was concentrated under reduced pressure. To the obtained residue, city water (300 mL) and ethyl acetate (300 mL) were added, and an organic layer was collected by solvent extraction operation. Subsequently, the aqueous layer was subjected to solvent extraction operation with ethyl acetate (200 mL) twice, and the obtained organic layer was combined with the preliminarily collected organic layer. Subsequently, this organic layer was washed with city water (400 mL) and saturated saline (400 mL) in this order and then dried over anhydrous magnesium sulfate. Subsequently, the organic layer was concentrated under reduced pressure to obtain 59.1 g of a brown liquid. The obtained brown liquid was purified by column chromatography (packing material: $SiO_2$ (1.2 kg), developing solvent: only ethyl acetate→ethyl acetate/methanol=10/1). Next, the purified product was further purified by column chromatography (packing material: $SiO_2$ (400 g), developing solvent: chloroform/methanol=15/1→10/1). Subsequently, the purified product was dried under high vacuum. In this way, 19.2 g (31.2 mmol, yield: 33%) of the fluorine atom-containing surfactant $F(CF_2)_6CH_2$ $(OCH_2CH_2)_6OH$ serving as component C-1 was obtained as a colorless liquid.

[Synthesis Example 2] Synthesis of Fluorine Atom-Containing Surfactant (C-2)

(1) The inside of a 100-mL reactor was kept in a nitrogen atmosphere, while the following reagents and solvents were added into this reactor:
Hexapropylene glycol (P400): 20 g (50 mmol, 1.0 eq.)
Carbon tetrachloride ($CCl_4$): 19.2 g (125 mmol, 2.5 eq.)
Tetrahydrofuran (THF): 100 mL Next, the reaction solution was cooled to −30° C. Next, dimethylaminophosphine (8.16 g, 10 mmol, 1.0 eq.) diluted in THF (30 mL) was gradually added to the reaction solution over 2 hours, and the mixture was then stirred at the same temperature for 30 minutes. Next, the reactor was taken out of the cooling bath, and the reaction solution was then stirred at room temperature for 2 hours. Subsequently, city water (350 mL) was added to the reaction solution (pale yellow suspension) to separate the reaction solution into two layers (CCl$_4$ layer and aqueous layer). Then, the aqueous layer was collected. Subsequently, the aqueous layer was washed twice with isopropyl ether (IPE) (150 mL). Next, a suspension obtained by suspending potassium hexafluorophosphate (18.4 g, 100 mmol, 2.0 eq.) in city water (250 mL) was prepared and then added to the aqueous layer, and the mixture was then sufficiently stirred. Subsequently, solvent extraction operation was performed three times using dichloromethane (150 mL). The organic layers were combined, then washed with city water (500 mL) and saturated saline (300 mL) in this order, and dried over anhydrous magnesium sulfate. Then, the organic layer was concentrated under reduced pressure to obtain 31 g of a light brown liquid (hereinafter, referred to as component "C-2-a").

(2) The following reagents and solvents were added to a 500-mL reactor:

1H,1H-perfluoro-1-heptanol: 21 g (60 mmol, 1.2 eq.)
THF: 120 mL)

Next, 60% NaH (3.9 g, 97.7 mmol, 1.2 eq.) was gradually added to the reaction solution without foaming the reaction solution. Then, the reaction solution was heated to 40° C. and stirred at this temperature (40° C.) for 1 hour. Subsequently, the solvent was distilled off under reduced pressure. To the obtained residue, component C-2-a (31 g) dissolved in anhydrous dioxane (350 mL) was added. Subsequently, the reaction solution was heated to 60° C. and stirred at this temperature (60° C.) for 24 hours. Subsequently, the reaction solution in a suspension state was concentrated under reduced pressure. To the obtained residue, city water (200 mL) and ethyl acetate (200 mL) were added, and an organic layer was collected by solvent extraction operation. Subsequently, the aqueous layer was subjected to solvent extraction operation with ethyl acetate (150 mL) twice, and the obtained organic layer was combined with the preliminarily collected organic layer. Subsequently, this organic layer was washed with city water (500 mL) and saturated saline (500 mL) in this order and then dried over anhydrous magnesium sulfate. Subsequently, the organic layer was concentrated under reduced pressure to obtain 29 g of a brown liquid. The obtained brown liquid was purified by column chromatography (packing material: SiO$_2$ (0.9 kg), developing solvent: ethyl acetate/hexane=2/1→only ethyl acetate). Next, the purified product was further purified by column chromatography (packing material: SiO$_2$ (300 g), developing solvent: chloroform/methanol=20/1→10/1). Subsequently, the purified product was dried under high vacuum. In this way, 1.71 g (2.78 mmol, yield: 14%) of the fluorine atom-containing surfactant F(CF$_2$)$_6$CH$_2$(OCH$_2$C$_2$H$_4$)$_6$OH serving as component C-2 was obtained as a colorless liquid.

Example 1

(1) Preparation of Photocurable Composition

First, the following reagents and solvents were mixed:

(component A) isobornyl acrylate (manufactured by Kyoeisha Chemical Co., Ltd.): 62 parts by weight (component A) 1,6-hexanediol diacrylate (manufactured by Osaka Organic Chemical Industry, Ltd.): 22 parts by weight (component A) Medol 10 (manufactured by Osaka Organic Chemical Industry, Ltd.): 16 parts by weight (component B) Irgacure 369 (manufactured by Ciba Japan Co., Ltd.): 3 parts by weight (component C-1) fluorine atom-containing surfactant (F(CF$_2$)$_6$CH$_2$(OCH$_2$CH$_2$)$_6$OH):2 parts by weight Next, a mixed solution of components A, B and C-1 was filtered through a 0.2 μm filter made of tetrafluoroethylene to obtain photocurable composition (a-1) of this Example (Example 1).

The surface tension of the obtained photocurable composition was measured using an automatic surface tensiometer CBVP-A3 (manufactured by Kyowa Interface Science Co., Ltd.) and consequently determined to be 23.9 mN/m. Also, the viscosity of the obtained photocurable composition was measured using a rotary cone-plate viscometer RE-85L (manufactured by Toki Sangyo Co., Ltd.) and consequently determined to be 6.95 CP.

(2) Preparation of Photocured Product
(2-1) Film Formation Step

15 μl of the photocurable composition (a-1) was added dropwise onto a 4-inch silicon wafer using a micropipette to form a film. In this context, an adhesion-promoting layer serving as an adhesive layer was formed at a thickness of 60 nm on this silicon wafer.

(2-2) Contact Step

Next, a 40 mm×40 mm quartz mold neither surface-treated nor patterned was placed on the silicon wafer and contacted with the photocurable composition (a-1).

(2-3) Light Irradiation Step

Next, the photocurable composition (a-1) in contact with the quartz mold was irradiated with light for 60 seconds. This light irradiation used a UV light source EXECURE 3000 (manufactured by Hoya Candeo Optronics Corporation) equipped with a 200 W mercury xenon lamp as an irradiation light source. Also, an interference filter VPF-50C-10-25-36500 (manufactured by Sigma Koki Co., Ltd.) was disposed between the irradiation light source and the quartz mold. The illuminance immediately below the quartz mold was 1 mW/cm$^2$ at a wavelength of 365 nm.

(2-4) Mold Release Step

Next, the quartz mold was lifted under conditions of 0.5 mm/s to separate the quartz mold from the cured film (photocured product) made of the photocurable composition. In this way, the photocured product was obtained.

(3) Evaluation of Photocured Product
(3-1) Measurement of Mold Release Force

In this context, force required for separating the quartz mold from the photocuried product (mold release), i.e., mold release force, in the mold release step was measured using a compact tension/compression load cell LUR-A-200NSA1 (manufactured by Kyowa Electronic Instruments Co., Ltd.). The force was measured four times under the same conditions, and an average of values of the second and fourth measurements was calculated as the mold release force of this Example. The results are shown in Table 1.

(3-2) TOF-SIMS Measurement

The surface of the photocured product obtained in this Example was subjected to TOF-SIMS measurement. This TOF-SIMS measurement used a TOF-SIMS V apparatus manufactured by ION-TOF GmbH. The measurement conditions were set as follows:

Primary ion: Bi$_3^+$, 0.3 pA (pulse current value)
Primary ion pulse frequency in sawtooth scan mode: 10 kHz (100 μs/shot)
Primary ion pulse width: approximately 0.8 ns
Measurement area: 500 μm×500 μm
The number of pixels in measurement area: 128×128
The number of scans: 32
Secondary ion detection mode: Positive
Gun for neutralization: ON For the TOF-SIMS measurement, 3 measurement locations were arbitrarily set for one sample and each measured.

Then, the area of a mass spectrum peak obtained at each measurement location was calculated as signal intensity. An average of the signal intensities of each peak was calculated. The calculation results are shown in Table 1 described later.

Example 2

(1) Preparation of Photocurable Composition

Photocurable composition (a-2) of this Example (Example 2) was prepared in the same way as in Example 1 except that the amount of the fluorine atom-containing surfactant ($F(CF_2)_6CH_2(OCH_2CH_2)_6OH$) blended as component C-1 in Example 1(1) was changed to 0.5 parts by weight.

The surface tension of the photocurable composition (a-2) was measured in the same way as in Example 1 and consequently determined to be 27.5 mN/m. Also, the viscosity of the photocurable composition (a-2) was measured in the same way as in Example 1 and consequently determined to be 6.77 cP.

(2) Preparation of Photocured Product

A photocured product was prepared in the same way as in Example 1 except that photocurable composition (a-2) was used instead of the photocurable composition (a-1) of Example 1. Also, mold release force measurement and TOF-SIMS measurement were carried out in the same way as in Example 1. The results are shown in Table 1.

Comparative Example 1

(1) Preparation of Photocurable Composition

First, the following reagents and solvents were mixed:

(component A) 1,6-hexanediol diacrylate (manufactured by Osaka Organic Chemical Industry, Ltd.): 100 parts by weight (component B) Irgacure 369 (manufactured by Ciba Japan Co., Ltd.): 3 parts by weight (component C-2) fluorine atom-containing surfactant: 2 parts by weight Next, a mixed solution of components A, B and C-2 was filtered through a 0.2 μm filter made of tetrafluoroethylene to obtain photocurable composition (b-1) of this Comparative Example (Comparative Example 1).

The surface tension of the photocurable composition (b-1) was measured in the same way as in Example 1 and consequently determined to be 19.5 mN/m. Also, the viscosity of the photocurable composition (b-1) was measured in the same way as in Example 1 and consequently determined to be 6.45 cP.

(2) Preparation of Photocured Product

A photocured product was prepared in the same way as in Example 1 except that photocurable composition (b-1) was used instead of the photocurable composition (a-1) of Example 1. Also, mold release force measurement and TOF-SIMS measurement were carried out in the same way as in Example 1. The results are shown in Table 1.

TABLE 1

|  | Example 1 | Example 2 | Comparative Example 1 |
|---|---|---|---|
| Mold release force (mN/m) | 128 | 129 | 150 |
| Signal intensity of $C_2H_5O^+$ (m/z = 45) | 284006 | 176815 | 781835 |
| Signal intensity of $C_3H_7O^+$ (m/z = 59) | 35811 | 26990 | 1735277 |

The comparison of Example 1 with Comparative Example 1 demonstrated that the photocured product of Example 1 required smaller mold release force than that of Comparative Example 1 despite the same content of the fluorine atom-containing surfactant. In Example 1, the $C_2H_5O^+$ ion (m/z=45) had signal intensity higher than that of the $C_3H_7O^+$ ion (m/z=59). By contrast, in Comparative Example 1, the $C_2H_5O^+$ ion (m/z=45) had signal intensity lower than that of the $C_3H_7O^+$ ion (m/z=59).

In the comparison of Example 2 with Comparative Example 1, the photocured product of Example 2 required smaller mold release force than that of Comparative Example 1 despite the lower content of the fluorine atom-containing surfactant than that of Comparative Example 1. In the photocured product of Example 2, the $C_2H_5O^+$ ion (m/z=45) had signal intensity higher than that of the $C_3H_7O^+$ ion (m/z=59), as in Example 1.

Comparative Example 2

(1) Preparation of Photocurable Composition

Photocurable composition (c-1) was prepared in the same way as in Example 1 except that the fluorine atom-containing surfactant (component C-1) was not contained therein in the photocurable composition preparation in Example 1(1).

The surface tension of the photocurable composition (c-1) was measured in the same way as in Example 1 and consequently determined to be 31.2 mN/m. Also, the viscosity of the photocurable composition (c-1) was measured in the same way as in Example 1 and consequently determined to be 6.80 cP.

(2) Preparation of Photocured Product

A photocured product was prepared in the same way as in Example 1 except that photocurable composition (c-1) was used instead of the photocurable composition (a-1) of Example 1. Also, mold release force was measured in the same way as in Example 1 and consequently determined to be 157 mN/m.

These results demonstrated that the photocured product prepared from the photocurable composition free from the fluorine atom-containing surfactant, as in Comparative Example 2, required larger mold release force than that of the photocured product prepared from the photocurable composition containing the fluorine atom-containing surfactant.

Comparative Example 3

(1) Preparation of Photocurable Composition

Photocurable composition (c-2) was prepared in the same way as in Comparative Example 1 except that the fluorine atom-containing surfactant (component C-2) was not contained therein in the photocurable composition preparation in Comparative Example 1(1).

The surface tension of the photocurable composition (c-2) was measured in the same way as in Example 1 and consequently determined to be 35.9 mN/m. Also, the viscosity of the photocurable composition (c-2) was measured in the same way as in Example 1 and consequently determined to be 6.34 cP.

(2) Preparation of Photocured Product

A photocured product was prepared in the same way as in Comparative Example 1 except that photocurable composition (c-2) was used instead of the photocurable composition (b-1) of Comparative Example 1. Also, mold release force was measured in the same way as in Example 1 and consequently determined to be 158 mN/m.

These results demonstrated that the photocured product prepared from the photocurable composition free from the fluorine atom-containing surfactant, as in Comparative Example 3, required larger mold release force than that of the photocured product prepared from the photocurable composition containing the fluorine atom-containing surfactant.

The results described above demonstrated that the photocured product that contained the fluorine atom-containing surfactant, wherein the $C_2H_5O^+$ ion (m/z=45) obtained by TOF-SIMS had signal intensity higher than that of the $C_3H_7O^+$ ion (m/z=59) required only small mold release force.

In the results described above, the photocured product was obtained wherein the ratio of the signal intensity of the $C_2H_5O^+$ ion (m/z=45) to that of the $C_3H_7O^+$ ion (m/z=59) was 5 or more and 10 or less. However, it is only required that the signal intensity of the $C_2H_5O^+$ ion (m/z=45) should be higher than that of the $C_3H_7O^+$ ion (m/z=59). Specifically, the signal intensity ratio is preferably 1.1 or more, more preferably 2 or more.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photocurable composition for obtaining a photocured product by irradiating the photocurable composition in contact with a mold with light, the photocurable composition comprising:
   at least a polymerizable monomer;
   a photopolymerization initiator; and
   a fluorine atom-containing surfactant represented by:

   $$R_1\text{-}x_1\text{-}R_2\text{-}x_2\text{-}R_3 \tag{1},$$

wherein $R_1$ represents a perfluoroalkyl group, $R_2$ represents a divalent substituent containing ethylene oxide, $R_3$ represents a polar functional group selected from an alkylhydroxyl group, a carboxyl group, a thiol group, a pyridyl group, a silanol group, and a sulfo group, and $x_1$ and $x_2$ each represent a single bond or a divalent substituent,
   wherein a ratio of the fluorine atom-containing surfactant to the photocured product is 0.001% by weight to 5% by weight, and
   wherein of secondary ion signals obtained by a surface analysis of the photocured product based on time-of-flight secondary ion mass spectrometry, an intensity of a $C_2H_5O^+$ ion signal is higher than that of a $C_3H_7O^+$ ion signal.

2. The photocurable composition according to claim 1, wherein the fluorine atom-containing surfactant is $F(CF_2)_6CH_2(OCH_2CH_2)_6OH$.

3. A method for forming a photocured product having a predetermined pattern shape on a substrate, the method comprising:
   coating the substrate with a photocurable composition;
   contacting the photocurable composition with a mold;
   irradiating the photocurable composition with light via the mold; and
   demolding the mold from the photocurable composition,
   wherein the photocured product contains a fluorine atom-containing surfactant represented by:

   $$R_1\text{-}x_1\text{-}R_2\text{-}x_2\text{-}R_3 \tag{1},$$

wherein $R_1$ represents a perfluoroalkyl group, $R_2$ represents a divalent substituent containing ethylene oxide, $R_3$ represents a polar functional group selected from an alkylhydroxyl group, a carboxyl group, a thiol group, a pyridyl group, a silanol group, and a sulfo group, and $x_1$ and $x_2$ each represent a single bond or a divalent substituent,
   wherein a ratio of the fluorine atom-containing surfactant to the photocured product is 0.001% by weight to 5% by weight, and
   wherein of secondary ion signals obtained by a surface analysis of the photocured product based on time-of-flight secondary ion mass spectrometry, an intensity of a $C_2H_5O^+$ ion signal is higher than that of a $C_3H_7O^+$ ion signal.

4. A method for producing a circuit substrate, the method comprising:
   applying a photocurable composition onto a substrate material;
   pressing a mold against the photocurable composition to form a pattern in the photocurable composition;
   irradiating the photocurable composition having the pattern with light to prepare a cured product having the pattern; and
   releasing the mold from the cured product to form, on the substrate material, a circuit structure based on the pattern in the cured product,
   wherein the cured product contains a fluorine atom-containing surfactant represented by:

   $$R_1\text{-}x_1\text{-}R_2\text{-}x_2\text{-}R_3 \tag{1},$$

wherein $R_1$ represents a perfluoroalkyl group, $R_2$ represents a divalent substituent containing ethylene oxide, $R_3$ represents a polar functional group selected from an alkylhydroxyl group, a carboxyl group, a thiol group, a pyridyl group, a silanol group, and a sulfo group, and $x_1$ and $x_2$ each represent a single bond or a divalent substituent,
   wherein a ratio of the fluorine atom-containing surfactant to the photocured product is 0.001% by weight to 5% by weight, and
   wherein of secondary ion signals obtained by a surface analysis of the photocured product based on time-of-flight secondary ion mass spectrometry, an intensity of a $C_2H_5O^+$ ion signal is higher than that of a $C_3H_7O^+$ ion signal.

5. The method according to claim 4, wherein the circuit substrate is a semiconductor device.

6. A method for producing a cured product having an elevation/depression pattern, the method comprising:
   applying a photocurable composition onto a base material;
   contacting a mold having an elevated/depressed surface with the photocurable composition to form a corresponding elevation/depression pattern in the photocurable composition;
   irradiating the photocurable composition having the elevation/depression pattern with light to prepare a photocured product; and releasing the mold from the photocured product to produce the cured product having the elevation/depression pattern, wherein the photocured product contains a fluorine atom-containing surfactant represented by:

$$R_1\text{-}x_1\text{-}R_2\text{-}x_2\text{-}R_3 \quad (1),$$

wherein $R_1$ represents a perfluoroalkyl group, $R_2$ represents a divalent substituent containing ethylene oxide, $R_3$ represents a polar functional group selected from an alkylhydroxyl group, a carboxyl group, a thiol group, a pyridyl group, a silanol group, and a sulfo group, and $x_1$ and $x_2$ each represent a single bond or a divalent substituent, wherein a ratio of the fluorine atom-containing surfactant to the photocured product is 0.001% by weight to 5% by weight, and wherein of secondary ion signals obtained by a surface analysis of the photocured product based on time-of-flight secondary ion mass spectrometry, an intensity of a $C_2H_5O^+$ ion signal is higher than that of a $C_3H_7O^+$ ion signal.

7. A method for forming a pattern, the method comprising:

applying a photocurable composition onto a base material;

contacting a mold having an elevated/depressed surface with the photocurable composition to form a corresponding elevation/depression pattern in the photocurable composition;

irradiating the photocurable composition having the elevation/depression pattern with light to prepare a cured product having the elevation/depression pattern; and releasing the mold from the cured product to form the pattern in the cured product, wherein the cured product contains a fluorine atom-containing surfactant represented by:

$$R_1\text{-}x_1\text{-}R_2\text{-}x_2\text{-}R_3 \quad (1),$$

wherein $R_1$ represents a perfluoroalkyl group, $R_2$ represents a divalent substituent containing ethylene oxide, $R_3$ represents a polar functional group selected from an alkylhydroxyl group, a carboxyl group, a thiol group, a pyridyl group, a silanol group, and a sulfo group, and $x_1$ and $x_2$ each represent a single bond or a divalent substituent, wherein a ratio of the fluorine atom-containing surfactant to the photocured product is 0.001% by weight to 5% by weight, and wherein of secondary ion signals obtained by a surface analysis of the photocured product based on time-of-flight secondary ion mass spectrometry, an intensity of a $C_2H_5O^+$ ion signal is higher than that of a $C_3H_7O^+$ ion signal.

* * * * *